(12) United States Patent
Duensing

(10) Patent No.: US 9,448,297 B2
(45) Date of Patent: Sep. 20, 2016

(54) MODE SPLITTER/COMBINER FOR NOISE FIGURE MINIMIZATION AND CONTROL OF POWER IN RF COIL ARRAYS

(75) Inventor: George Randall Duensing, Gainesville, FL (US)

(73) Assignee: KONINKLIJKE PHILIPS N.V., Eindhoven (NL)

(*) Notice: Subject to any disclaimer, the term of this patent is extended or adjusted under 35 U.S.C. 154(b) by 99 days.

(21) Appl. No.: 14/240,520

(22) PCT Filed: Aug. 27, 2012

(86) PCT No.: PCT/IB2012/054366
§ 371 (c)(1),
(2), (4) Date: Feb. 24, 2014

(87) PCT Pub. No.: WO2013/035007
PCT Pub. Date: Mar. 14, 2013

(65) Prior Publication Data
US 2014/0228672 A1    Aug. 14, 2014

Related U.S. Application Data

(60) Provisional application No. 61/531,782, filed on Sep. 7, 2011.

(51) Int. Cl.
*A61B 5/05* (2006.01)
*G01R 33/565* (2006.01)
(Continued)

(52) U.S. Cl.
CPC ......... *G01R 33/56554* (2013.01); *G01R 33/36* (2013.01); *G01R 33/365* (2013.01); *H01Q 3/26* (2013.01)

(58) Field of Classification Search
CPC ............ G01R 33/56554; G01R 33/36; G01R 33/365; H01Q 3/26
USPC ................................................. 600/407–430
See application file for complete search history.

(56) References Cited

U.S. PATENT DOCUMENTS 4,682,176 A * 7/1987 Jones ............................ 342/175
5,027,125 A * 6/1991 Tang ............................. 342/368
(Continued)

FOREIGN PATENT DOCUMENTS

WO    2010113093 A1    10/2010

OTHER PUBLICATIONS

Duensing et al, "Maximizing Signal-To-Noise Ratio in the Presence of Coil Coupling", Journal of Magnetic Resonance, Series B, vol. 111, No. 3, June 1, 1996, pp. 230-236.
(Continued)

*Primary Examiner* — Sanjay Cattungal

(57) ABSTRACT

A magnetic resonance (MR) system (10) minimizes noise for modes of an array of coils ($26_1$, $26_2$, ..., $26_n$). The system (10) includes an array of coils ($26_1$, $26_2$, ..., $26_n$) in which the coils of the array ($26_1$, $26_2$, ... $26_n$) share impedances. A splitter/combiner (30) receives a plurality of signals ($S_1$; $S_2$, ..., $S_n$) from each of the coils ($26_1$, $26_2$, ..., $26_n$) and converts the plurality of signals ($S_1$; $S_2$, ..., Sn) to a plurality of signals ($S_1$; $S_2$, ..., $S_n$) which are compensated for the shared impedance. The splitter/combiner (30) splits the received signals ($S_1$; $S_2$, ..., $S_n$) into components and combines components of like frequency and/or phase to create the impedance compensated signals ($S_1$; $S_2$, ..., $S_n$). Each impedance compensated signal is amplified by a corresponding preamplifier ($38_1$, $38_2$, ..., $38_n$).

16 Claims, 2 Drawing Sheets

(51) Int. Cl.
*G01R 33/36* (2006.01)
*H01Q 3/26* (2006.01)

(56) References Cited

U.S. PATENT DOCUMENTS

| | | | |
|---|---|---|---|
| 5,631,611 A | 5/1997 | Luu | |
| 7,057,387 B2* | 6/2006 | Duensing et al. | 324/307 |
| 7,999,548 B1* | 8/2011 | Brown et al. | 324/318 |
| 2004/0193038 A1* | 9/2004 | Reykowski et al. | 600/410 |
| 2004/0257079 A1* | 12/2004 | Dumoulin et al. | 324/318 |
| 2005/0083055 A1* | 4/2005 | Chu et al. | 324/309 |
| 2007/0273377 A1* | 11/2007 | Yang et al. | 324/318 |
| 2008/0169815 A1* | 7/2008 | Viswanathan | 324/322 |
| 2008/0275332 A1* | 11/2008 | Alradady et al. | 600/422 |
| 2009/0224763 A1* | 9/2009 | Duensing | 324/318 |
| 2009/0238593 A1* | 9/2009 | Kinouchi et al. | 399/67 |
| 2011/0121834 A1* | 5/2011 | Soutome et al. | 324/318 |
| 2013/0137969 A1* | 5/2013 | Jones | 600/421 |
| 2014/0203804 A1* | 7/2014 | Duensing | 324/307 |
| 2014/0228672 A1* | 8/2014 | Duensing | 14/240 |

OTHER PUBLICATIONS

Sodin, "Frequency-Independent Approximate Compensation of Mutual Coupling in a Linear Array Antenna", IEEE Tranactions on Antennas and Propagation, IEEE Serivce Center, vol. 57, No. 8, August 1, 2009, pp. 2293-2296.

Lee et al, "Coupling and Decoupling Theory and Its Appication to the MRI Phased Array", Magnetic Resonance in Medicine, vol. 48, January 1, 2002, pp. 203-213.

* cited by examiner

MODE SPLITTER/COMBINER FOR NOISE FIGURE MINIMIZATION AND CONTROL OF POWER IN RF COIL ARRAYS

CROSS-REFERENCE TO PRIOR APPLICATIONS

This application is the U.S. National Phase application under 35 U.S.C. §371 of International Application No. PCT/IB2012/054366, filed on Aug. 27, 2012, which claims the benefit of U.S. Provisional Patent Application No. 61/531,782 filed on Sep. 7, 2011. These applications are hereby incorporated by reference herein.

The present application relates generally to radiofrequency (RF) arrays. It finds particular application in conjunction with magnetic resonance imaging (MRI) and magnetic resonance spectroscopy (MRS), and will be described with particular reference thereto. However, it is to be understood that it also finds application in other usage scenarios, such as radar, mobile communication, radio astronomy, and so on, and is not necessarily limited to the aforementioned application.

One challenge with employing multiple receive coils is optimizing the signal-to-noise ratio (SNR). The signal-to-noise ratio (SNR) of multiple receive coils is typically optimized by noise matching each receive coil to a preamplifier using port impedance of the receive coil when all other receive coils are approximately in the "open" state and therefore assumed to be in isolation. However, this approach produces less than optimal SNR in some instances. The present application recognizes that the receive coils generally have shared impedance. As such, the impedance that determines noise figure is not the port impedance, but the eigenvalues of the impedance. As long as there is shared impedance between receive coils, one passive noise matching circuit between each receive coil and a preamplifier cannot produce optimal SNR for all modes.

The present application provides new and improved systems and methods which overcome the above-referenced problems and others.

In accordance with one aspect, a magnetic resonance (MR) system with noise figure minimization for modes of an array of coils is provided. The system includes an array of coils including at least two coils. The at least two coils share impedance. The system further includes a splitter/combiner. The splitter/combiner receives a plurality of signals from the array or a plurality of signals that are to be transmitted by the array. The splitter/combiner further converts the plurality of signals to a plurality of signals which are compensated for the shared impedance. The system further includes a plurality of preamplifiers receiving the plurality of shared impedance compensated signals from the splitter/combiner.

In accordance with another aspect, a method for noise figure minimization for modes of an array of coils employed in a magnetic resonance (MR) system is provided. The method includes receiving a plurality of signals from an array of coils or a plurality of signals that are to be transmitted by the array of coils. The array of coils include at least two coils with a shared impedance. The plurality of received signals are converted to a plurality of signals which are compensated for the shared impedance, and the shared impedance compensated signals are preamplified.

In accordance with another aspect, a magnetic resonance (MR) system with noise figure minimization for modes of an array of coils is provided. The system includes an array of coils, the array including at least two coils sharing impedance. The system further includes a splitter/combiner. The splitter/combiner receives a plurality of RF signals from a transmitter and converts the plurality of signals to a plurality of signals which are compensated for the shared impedance. The shared impedance compensated signals are applied to the coil array.

One advantage resides in an increase in SNR for all modes of an array of receive and/or transmit coils.

Another advantage resides in that accurate adjustment of isolation between receive and/or transmit coils is less critical.

Another advantage resides in improved parallel imaging techniques.

Still further advantages of the present invention will be appreciated to those of ordinary skill in the art upon reading and understand the following detailed description.

The invention may take form in various components and arrangements of components, and in various steps and arrangements of steps. The drawings are only for purposes of illustrating the preferred embodiments and are not to be construed as limiting the invention.

Figure 1:
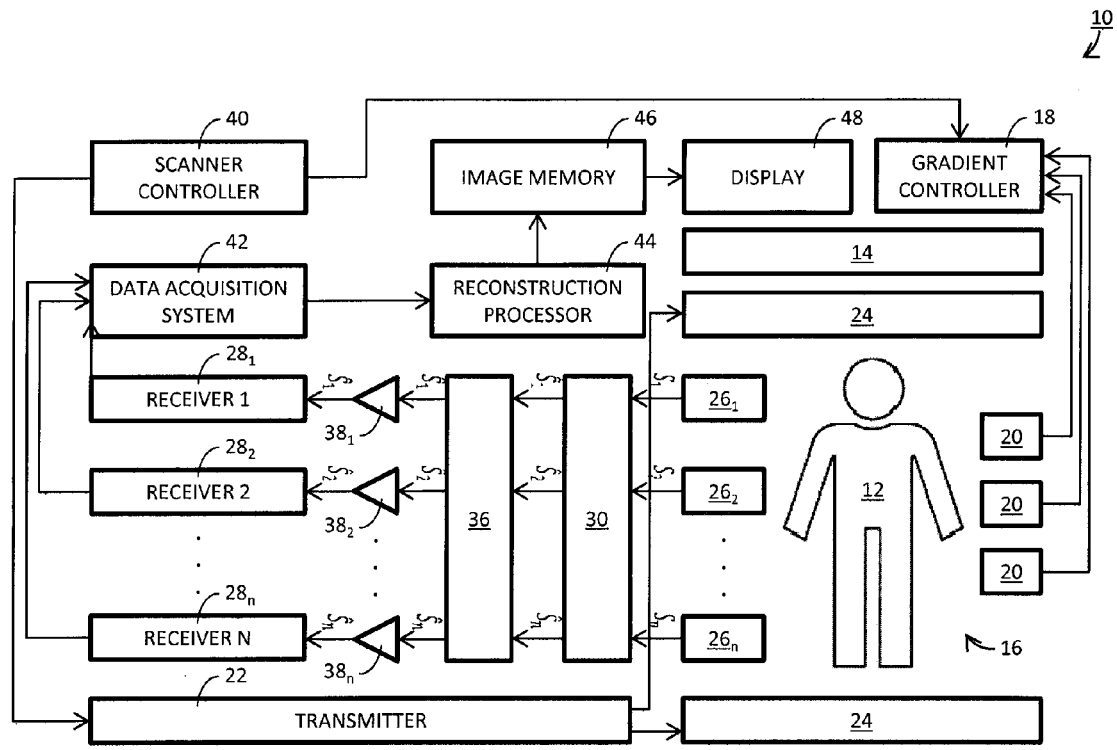
FIG. 1 is a block diagram of a magnetic resonance imaging system employing a splitter/combiner.

With reference to FIG. 1, a magnetic resonance (MR) system 10 utilizes magnetic resonance to form two- or three-dimensional images of a subject 12. The subject 12 is arranged in a strong, static $B_0$ magnetic field, which causes hydrogen dipoles in the subject 12 to preferentially align to the static $B_0$ magnetic field. Applying an electromagnetic field, such as an RF pulse, at an excitation frequency, such as the Larmor frequency or MR frequency, to the hydrogen dipoles causes the hydrogen dipoles to absorb energy and resonate. The absorbed energy and the excitation frequency are dependent upon the strength of the magnetic field and the hydrogen dipole to be resonated.

After the resonance excitation pulse, the hydrogen dipoles decay to a lower energy state and emit the absorbed energy as a magnetic resonance signal. The excited hydrogen dipoles decay at different rates depending on how the hydrogen bonds in the molecules, such as water, of tissue. Further, the frequency of the resonance signal depends on the current strength of the magnetic field. By applying magnetic field gradients to the subject 12, as well as observing the decay of the hydrogen dipoles and the frequency and phase of the emitted resonance signal, two- or three-dimensional images can be formed.

The MR system 10 includes a main magnet 14 that creates a strong, static $B_0$ magnetic field extending through an examination volume 16. The examination volume 16 accommodates the subject 12. The static $B_0$ magnetic field typically extends through the examination volume 16 along the length of the subject 12. Further, the strength of the static $B_0$ magnetic field is commonly one of 0.23 Tesla, 0.5 Tesla, 1.5 Tesla, 3 Tesla, 7 Tesla, and so on in the examination region 16, but other strengths are contemplated. In some embodiments, the main magnet 14 is a superconducting magnet disposed in suitable cryogenic refrigeration. In other embodiments, the main magnet 14 is a resistive magnet, optionally cooled by water or the like. For higher static $B_0$ magnetic fields, bore or solenoid magnets are commonly used. Open or c-type magnets are after used at lower static $B_0$ magnetic fields.

A gradient controller 18 controls a plurality of magnetic field gradient coils 20 to selectively superimpose magnetic field gradients, such as x, y and z gradients, on the static $B_0$ magnetic field in the examination volume 16. In one embodiment, a transmitter 22 transmits $B_1$ resonance excitation and manipulation RF pulses into the examination volume 16 via a whole body coil 24. The $B_1$ pulses are typically of short duration and, when taken together with magnetic field gradients, achieve a selected manipulation of magnetic resonance. For example, the $B_1$ pulses excite the hydrogen dipoles to resonance and the magnetic field gradients encodes spatial information in the frequency and phase of the resonance signal.

A plurality of receive coils $26_1, 26_2, \ldots, 26_n$ form an array which receives the spatially encoded magnetic resonance signal. The plurality of receive coils $26_1, 26_2, \ldots, 26_n$ inherently couple and share impedances. Substantially any number of receive coils can be used and the coils can have substantially any spatial arrangement. In parallel imaging, such as SENSE, 8, 16 or more receive coils are positioned circumferentially around the subject 12. A plurality of receivers $28_1, 28_2, \ldots, 28_n$ define a plurality of receive channels, one for each of the plurality of receive coils $26_1, 26_2, \ldots, 26_n$. A splitter/combiner 30 between the plurality of receive coils $26_1, 26_2, \ldots, 26_n$ and the plurality of receivers $28_1, 28_2, \ldots, 28_n$ advantageously compensates for shared impedances between the receiver coils $26_1, 26_2, \ldots, 26_n$ by creating eigenmodes of the array.

The splitter/combiner 30 receives a plurality of signals $S_1, S_2, \ldots S_n$ from the receive coil array. Each of the plurality of signals $S_1, S_2, \ldots, S_n$ corresponds to a different one of the plurality of receive coils $26_1, 26_2, \ldots, 26_n$. Each signal represents the received resonance signal plus an undesirable noise component. The splitter/combiner 30 is designed taking advantage of symmetry of the array to convert the plurality of signals $S_1, S_2, \ldots, S_n$ from the receive coils $26_1, 26_2, \ldots, 26_n$ to a plurality of a signals $\hat{S}_1, \hat{S}_2, \ldots, \hat{S}_n$ representing eigenmodes with zero shared impedance for the specific array geometry. The signals $S_1, S_2, \ldots S_n$ are all functions of each other due to the shared impedance; whereas, the signals $\hat{S}_1, \hat{S}_2, \ldots, \hat{S}_n$ are substantially cross talk free.

To design the splitter/combiner 30, the symmetry of the coil impedance matrix of the array is analyzed. Based upon this analysis, an eigenmode set of this symmetry is generated and implemented in a network of splitters and combiners, as described below. For more information, attention is directed to U.S. Pat. No. 7,057,387 to Duensing et al., issued Jun. 6, 2006. The shared impedance matrix is to some extent dependent on loading conditions (e.g., different subjects). However, experience has shown that the changes from subject to subject are normally not enough to produce a significant reduction in effectiveness of the splitter/combiner 30.

Each eigenmode corresponds to a different resonant frequency and/or phase and is a summation of the components from each receive coil at the resonance frequency and/or phase. In some embodiments, the components are weighted. Typically, there is an eigenmode for each of the receive coils $26_1, 26_2, \ldots, 26_n$. However, in some embodiments, there are fewer eigenmodes than there are receive coils. For example, the splitter/combiner 30 can receive signals from 16 receive coils and create 8 eigenmodes. Typically, there are fewer eigenmodes than receive coils when eigenmodes share the same resonant frequency and/or phase.

To illustrate the operation of the splitter/combiner 30, suppose the receive coils $26_1, 26_2, \ldots, 26_n$ include two receive coils coupled together via mutual inductance and include modes of current in which the current in the two coils is either precisely in phase (0 degrees) or out of phase (180 degrees), such as quadrature coils. These two modes are resonant at two different frequencies because the total inductance varies between the current patterns. When the splitter/combiner 30 is designed for 0/180 degrees and attached to the two receive coils, one port of the splitter/combiner 30 drives one mode at one of the resonant frequencies and the other port will drive the other mode at the other resonant frequency. These two eigenmodes, by definition, have zero shared impedance.

Figure 2:
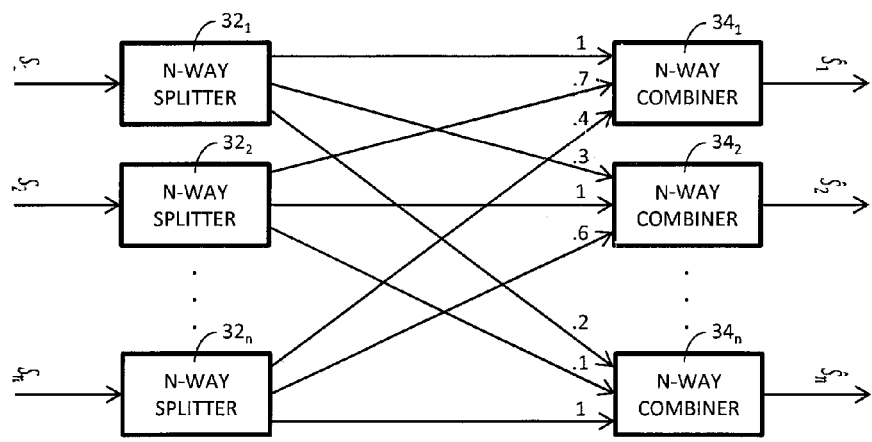
FIG. 2 is a block diagram of a splitter/combiner network.

With reference to FIG. 2, the splitter/combiner 30 includes a plurality of splitters $32_1, 32_2, \ldots, 32_n$ and a plurality of combiners $34_1, 34_2, \ldots, 34_n$. The plurality of splitters $32_1, 32_2, \ldots, 32_n$ include a splitter for each of the receive coils $26_1, 26_2, \ldots, 26_n$, and the plurality of combiners $34_1, 34_2, \ldots, 34_n$ include a combiner for each of the eigenmodes. The splitters $32_1, 32_2, \ldots, 32_n$ split corresponding signals from the receive coils $26_1, 26_2, \ldots, 26_n$ into frequency- and/or phase-specific components. The frequencies are based on the resonant frequencies of the eigenmodes. The combiners $34_1, 34_2, \ldots, 34_n$ combine the components for corresponding eigenmodes. Optionally, the components are weighted, as illustrated at the inputs of each of the combiners $34_1, 34_2, \ldots, 34_n$.

Referring back to FIG. 1, in some embodiments, a matching circuit 36 is employed after the splitter/combiner 30. The eigenmodes appear at different frequencies than the single receive coil frequencies due to mutual inductance. Hence, matching is done by selecting the reactances of the combiners $34_1, 34_2, \ldots, 34_n$ and/or with the matching circuit 36 to move the respective frequencies of the eigenmodes to the single receive coil frequencies and to match the input impedance of a plurality of preamplifiers $38_1, 38_2, \ldots, 38_n$. A global change of all of the impedances (e.g., matching all the receive coils $26_1, 26_2, \ldots, 26_n$) to 75 ohms instead of 50 ohms can be done. When matching, symmetry is maintained to produce the eigenmode behavior. The overall matching strategy can be optimized to maintain symmetry and produce the lowest overall noise figure for the system using circuit analysis.

The preamplifiers $38_1, 38_2, \ldots, 38_n$ follow the splitter/combiner 30 and, if applicable, the matching circuit 36. Typically, there is a preamplifier or a preamplifier channel/input corresponding to each of the eigenmodes. Advantageously, by placing the splitter/combiner 30 before the preamplifiers $38_1, 38_2, \ldots, 38_n$, an increase in SNR is produced by lower noise figures for all modes of the array. Further, accurate adjustment of isolation between the receive coils $26_1, 26_2, \ldots, 26_n$ is not critical since only the symmetry is important for producing the modes. In one advantageous embodiment, the preamplifiers $38_1, 38_2, \ldots, 38_n$, the splitter/combiner 30, and the matching circuit 36 are mounted on or close to the coil assembly to minimize the effects of any noise along the transmission path from the coil assembly to the receivers $28_1, 28_2, \ldots, 28_n$.

It should be noted that the value of creating eigenmodes is dependent upon the amount of mutual impedance. Because the splitter/combiner 30 is before the preamplifiers $38_1, 38_2, \ldots, 38_n$, its losses are part of the overall noise figure of the system 10. If the mutual impedance is naturally small, then the losses of the splitter/combiner 30 might overshadow the improvement due to improved noise figure. Experiments have demonstrated improvement with relatively strong coupling.

A scanner controller 40 controls the gradient controller 18 and one or more transmitters 22 to generate any of a plurality of MRI sequences, such as echo planar imaging, echo volume imaging, gradient and spin echo imaging, fast spin echo imaging, and the like. For the selected sequence, the receivers $28_1, 28_2, \ldots, 28_n$ receive at least one data line for each eigenmode in rapid succession following each pulse transmitted. A data acquisition system 42 performs analog-to-digital conversion of the received signals and converts each MR data line to a digital format suitable for further processing. Although discussed in terms of using the whole body coil 24 to transmit the $B_1$ pulses, it is to be appreciated that the receive coils $26_1, 26_2, \ldots, 26_n$ can also be used as transmit coils.

The digital data for each eigenmode is reconstructed into an image representation by a reconstruction processor 44 which applies a Fourier transform or other appropriate reconstruction algorithm, such as SENSE or SMASH when the coil array is operated in a parallel imaging mode. The image may represent a planar slice through the subject 12, an array of parallel planar slices, a three-dimensional volume, or the like. The images from the different eigenmodes are combined by the reconstruction processor 44 such as by using SENSE, SMASH or other parallel imaging techniques. The composite image is then stored in an image memory 46 where it may be accessed for converting slices, projections, or other portions of the image representation into appropriate format for visualization, for example, via a display 48 which displays the resultant image. The reconstructed images can also be sent to storage, such as a medical records database.

Although not illustrated in the FIGURES, in some embodiments, the splitter/combiner 30 and the optional matching circuit 36 are used with one or more transmit coils and/or an array of transmit/receive coils employed for both transmitting and receiving In such embodiments, symmetry of the impedance matrix of the array is analyzed to determine an eigenmode set, as discussed above. The splitter/combiner 30 is then tailored to the eigenmodes and matching is optimized, optionally using the matching circuit 36. In this manner, the transmitted $B_1$ pulses are compensated for cross talk due to shared impedance.

Figure 3:
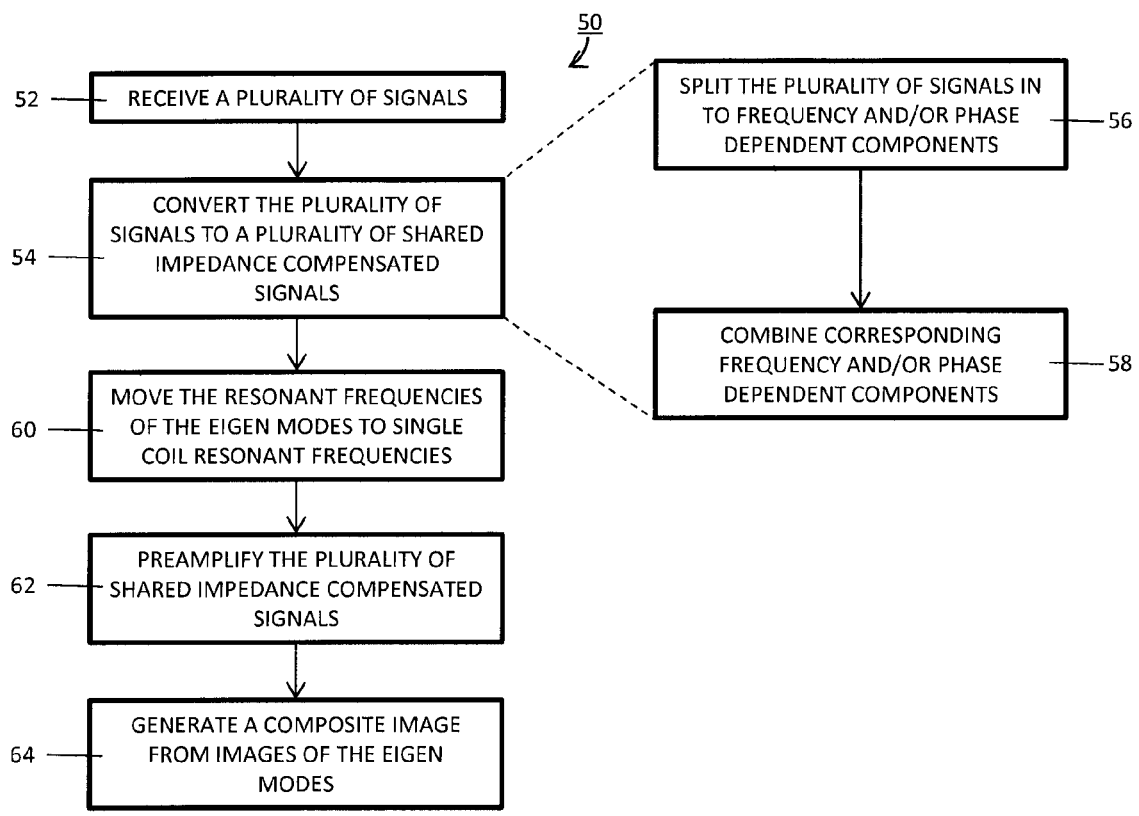
FIG. 3 is a block diagram of a method for noise figure minimization in a system employing a splitter/combiner.

With reference to FIG. 3, a method 50 for noise figure minimization for all modes of the array defined by the receive coils 26 is provided. The method 50, however, is equally amenable to an array defined by the at least one transmit coil 24 or a receive/transmit array. The method 50 includes receiving 52 a plurality of signals from the array, where the array includes at least two coils which share impedance. The plurality of received signals are converted 54 to a plurality of signals representing eigenmodes of the array. The eigenmodes are suitably generated based on symmetry of the impedance matrix of the array and share zero or minimized impedance. The conversion typically includes splitting 56 the signals from the array in to frequency and/or phase dependent components and combining 58 corresponding components to output a single frequency and/or phase. The frequencies correspond to the resonant frequencies of the eigenmodes and the combinations corresponds to an eigenmode. In some embodiments, the resonant frequencies of the eigenmodes are moved 60 to single coil resonant frequencies through impedance matching. The signals representing the eigenmodes are then preamplifed 62 and a composite image is generated 64 from images generated for each of the eigenmodes.

One method for creating the splitter/combiner 30 is to introduce test signals to a nominal network. The amplitude and phase of the reflected power is measured with a network analyzer to generate an impedance or reactance network. The eigenmodes are calculated from an inversion of this impedance/reactance matrix. Control signals are applied and impedances or reactances of the network are adjusted. When adjusting the impedance/reactance for an individual subject or coil placement, a varactor, a varicap, or the like can be used to adjust the impedance/reactance remotely. This enables the impedance/reactance network to be adjusted for each patient, coil placement, motion state, or the like.

As used herein, a memory includes one or more of a non-transient computer readable medium; a magnetic disk or other magnetic storage medium; an optical disk or other optical storage medium; a random access memory (RAM), read-only memory (ROM), or other electronic memory device or chip or set of operatively interconnected chips; an Internet/Intranet server from which the stored instructions may be retrieved via the Internet/Intranet or a local area network; or so forth. Further, as used herein, a processor includes one or more of a microprocessor, a microcontroller, a graphic processing unit (GPU), an application-specific integrated circuit (ASIC), a field-programmable gate array (FPGA), and the like; a user input device includes one or more of a mouse, a keyboard, a touch screen display, one or more buttons, one or more switches, one or more toggles, and the like; and a display includes one or more of a LCD display, an LED display, a plasma display, a projection display, a touch screen display, and the like.

The invention has been described with reference to the preferred embodiments. Modifications and alterations may occur to others upon reading and understanding the preceding detailed description. It is intended that the invention be construed as including all such modifications and alterations insofar as they come within the scope of the appended claims or the equivalents thereof.

The invention claimed is:

1. A magnetic resonance (MR) system with noise figure minimization for modes of an array of coils, said system comprising:
    an array of coils including at least two coils which share impedance;
    a splitter/combiner receiving a plurality of signals from the array or a plurality of signals that are to be transmitted by the array and converting the plurality of signals to a plurality of compensated signals, wherein the compensated signals are compensated for the shared impedance; and,
    a plurality of preamplifiers receiving the plurality of compensated signals from the splitter/combiner;
    wherein impedance of the splitter/combiner is optimized to move eigenmode resonant frequencies to single coil resonant frequencies.

2. The magnetic resonance system according to claim 1, wherein the array includes a plurality of radio frequency receive coils.

3. The magnetic resonance system according to claim 1 wherein a plurality of preamplifiers share impedance, wherein the splitter/combiner is configured to compensate for the shared impedance of the preamplifiers and the coils of the array.

4. A magnetic resonance system, said system comprising:
    a plurality of at least three receive coils formed in an array such that the receive coils electrically couple and share noise;
    a splitter/combiner connected to the array of receive coils and configured to receive a plurality of signals from the array and convert the plurality of signals to a plurality of compensated signals wherein the compensated signals are compensated for the shared noise by creating eigenmodes, wherein the splitter/combiner comprises:

a plurality of splitters each connected to receive a signal from one of the receive coils, the plurality of splitters each configured to break signals into frequency and/or phase dependent components; and, a plurality of combiners connected with the splitters and configured to combine the components of a frequency and/or a phase into corresponding outputs;

a plurality of preamplifiers connected with the combiners and configured to receive the plurality of compensated signals from the splitter/combiner, wherein the splitter/combiner is connected between the radio frequency receive coil array and the preamplifiers to compensate for shared noise among the receive coils and among the preamplifiers.

5. The magnetic resonance system according to claim 4, wherein components of like frequency and/or phase are weighted during the combining.

6. The magnetic resonance system according to claim 4, wherein the plurality of compensated signals has fewer signals than the plurality of signals from the array of receiver coils.

7. The magnetic resonance system according to claim 4, further comprising:
a matching circuit which includes reactance configured to match the inputs of the splitter/combiner to input impedance of the plurality of preamplifiers.

8. The magnetic resonance system according to claim 4, further comprising:
a plurality of receivers configured to demodulate signals output by the plurality of preamplifiers; and,
a reconstruction processor configured to reconstruct a composite image from images generated from the demodulated signals.

9. The magnetic resonance system according to claim 4, further comprising:
a processor configured to perform a parallel imaging technique.

10. A method for noise figure minimization in a magnetic resonance system, said method comprising:
receiving a plurality of signals with an array of radio frequency coils, the array of radio frequency coils including at least two radio frequency coils which couple and share noise;
preamplifying one or more signals from the array of radio frequency coils with at least two preamplifiers, the two preamplifiers sharing an impedance; and
with a splitter/combiner array disposed between the radio frequency coils and the preamplifiers, moving eigenmode resonant frequencies to single coil resonant frequencies of a single one of the radio frequency coils.

11. The method according to claim 10, wherein the preamplified signals have substantially no shared impedance.

12. The method according to claim 10, wherein the splitter/combiner determines eigenmode from the signals from the radio frequency coils.

13. The method according to claim 10, further including:
splitting the signals from the array into frequency and/or phase dependent components; and,
weighting and combining corresponding components based on frequency and/or phase such that noise components of the plurality of signals from the array of radio frequency coils cancel, wherein the weighting generates compensated signals, the compensated signals being amplified by the preamplifiers.

14. The method according to claim 10, further comprising:
converting the signals from the array of radio frequency coils to compensated signals by the splitter/combiner array; and
adjusting impedances and/or reactances between splitters and combiners of the splitter/combiner array such that the compensation minimizes noise for an examined subject.

15. The method according to claim 10, further including:
generating a composite image from images generated for each of the eigenmode resonant frequencies.

16. A magnetic resonance system comprising:
a coil array including n coils, where n is a plural integer, each coil outputting a signal with a received signal component and a noise component;
an array of signal splitters and signal combiners having n inputs each connected with a corresponding one of the n coils and a plurality of outputs, each output corresponding to an eigenmode of the coil array;
a plurality of preamplifiers including a preamplifier connected to each of the outputs;
the array of signal splitters and signal combiners comprising:
splitters configured to split the signals received from the coils into frequency and/or phase specific components based on resonance frequencies of the eigenmodes of the coil array,
impedances and/or reactances configured to weight the frequency and/or phase specific components, and
combiners configured to combine the weighted components into an output signal corresponding to each eigenmode.

* * * * *